United States Patent [19]
Witherspoon

[11] Patent Number: 4,717,190
[45] Date of Patent: Jan. 5, 1988

[54] WAFER HANDLING AND PLACEMENT TOOL

[76] Inventor: Linda L. Witherspoon, 22 Cottonwood La., Los Lunas, N. Mex. 87031

[21] Appl. No.: 925,241

[22] Filed: Oct. 30, 1986

[51] Int. Cl.$^4$ .................... B25B 9/02; H01L 21/68
[52] U.S. Cl. .................... 294/99.2; 294/33; 294/902
[58] Field of Search .......... 294/6, 8.5, 11, 25, 294/33, 99.2, 902; 128/321, 354

[56] References Cited

U.S. PATENT DOCUMENTS

| | | | |
|---|---|---|---|
| 619,949 | 2/1899 | Flynn | 294/99.2 |
| 1,062,464 | 5/1913 | Haynes | 294/99.2 X |
| 1,266,112 | 5/1918 | Ferdon | 294/33 |
| 1,634,856 | 7/1927 | Skroch | 294/99.2 |
| 3,291,476 | 12/1966 | Calkin | 294/99.2 X |
| 3,496,807 | 2/1970 | Jones et al. | 294/99.2 |
| 3,665,790 | 5/1972 | Jones | 294/99.2 |
| 4,452,106 | 6/1984 | Tartaglia | 294/99.2 |

FOREIGN PATENT DOCUMENTS

| | | | |
|---|---|---|---|
| 52-14372 | 2/1977 | Japan | 294/99.2 |
| 52-28876 | 3/1977 | Japan | 294/99.2 |

OTHER PUBLICATIONS

Western Electric Technical Digest, No. 66, Apr. 1982, "Tool for Disc-Like Articles" by Eckert et al.

*Primary Examiner*—Johnny D. Cherry
*Attorney, Agent, or Firm*—Fleit, Jacobson, Cohn & Price

[57] ABSTRACT

A spring arm tool is provided for clamp engaging and supporting wafers while the tool is hand held. The tool includes a pair of relatively swingable jaw element supporting support arms and the jaw elements are notched to enjoy multiple point contact with a wafer peripheral portion. Also, one disclosed form of the tool includes remotely operable workpiece ejecting structure carried by the jaw elements thereof.

11 Claims, 9 Drawing Figures

WAFER HANDLING AND PLACEMENT TOOL

The Government has rights in this invention pursuant to Contract No. 26-1631 awarded by the U.S. Department of Energy.

BACKGROUND OF THE INVENTION

1. Field of the Invention

This invention relates to a readily manually supportable, actuatable and positionable tool for handling thin delicate panel components such as wafers.

2. Description of Related Art

Various different forms of devices heretofore have been provided for precisely engaging, picking up, moving, positioning and releasing various different forms of objects including electronic components. Examples of these previously known forms of devices are disclosed in U.S. Pat. Nos. 3,380,141, 3,665,790, 3,651,957, 3,741,602, 3,802,049, 4,050,729, 4,179,803, 4,290,732 and 4,445,719. However, these previously known devices do not include the simplified structure and operational features of the instant invention which enable a worker to engage, pick up, move from one location to another and then disengage a relatively fragile electronic wafer in an efficient and confident manner.

SUMMARY OF THE INVENTION

The wafer handling and placement tool of the instant invention has been designed to assist an operator in placing a silicone wafer into a vertical, horizontal, or inclined surface CVD reactor susceptor, without contaminating either the wafer or the susceptor.

There are various problems which are encountered when a tool is used to handle a wafer. The tool portions which engage the wafer must be constructed of a nonmetallic material. Metal residue left on the wafer surface can generate high device leakage currents after the device is processed. Further, the portions of the tool which engage the wafer must be constructed of a material to withstand high temperatures without distortion. Also, those portions of the tool which engage the wafer must contact the wafer only at non-active areas on the wafer. If there is any contamination on the portions of the tool which engage the wafer such contamination will contaminate all areas of the wafer engaged by the tool. Also, all contamination, which can easily occur on any surface, must be removed through the use of acids such as hydrofluoric and sulfuric acids in order to insure that the wafer engaging portions of the tool are not contaminated. Therefore, the wafer engaging portions of the tool must be able to withstand most acids.

It is further pointed out that a hand tool for engaging, lifting and precisely placing wafers must have reusable and replaceable components for actually engaging and lifting a wafer and the tool must be constructed in a manner such that it will not contaminate anything it touches. It must not outgas or give off particles that would cause contamination.

The main object of this invention is to provide a hand tool for engaging, supporting, displacing and positioning silicone wafers and the like.

Another object of this invention is to provide a tool which will be capable of engaging a wafer in a manner such that the surfaces of the wafer engaged by the tool will not be contaminated by residue from the tool left upon the wafer.

A further important object of this invention is to provide a tool whose workpiece engaging components may withstand high temperatures.

A further object of this invention is to provide a tool in accordance with the preceding objects and including workpiece engaging portions which will withstand most acids.

Yet another object of this invention is to provide a tool including workpiece engaging portions which are reusable and replaceable.

A further object of this invention is to provide a tool which is free of portions thereof which might give off particles of contamination.

A final object of this invention to be specifically enumerated herein is to provide a tool in accordance with the preceding objects and which will conform to conventional forms of manufacture, be of simple construction and easy to use so as to provide a device that will be economically feasible, long lasting and relatively troublefree in operation.

These together with other objects and advantages which will become subsequently apparent reside in the details of construction and operation as more fully hereinafter described and claimed, reference being had to the accompanying drawings forming a part hereof, wherein like numerals refer to like parts throughout.

DESCRIPTION OF THE PREFERRED EMBODIMENTS

Figure 1:
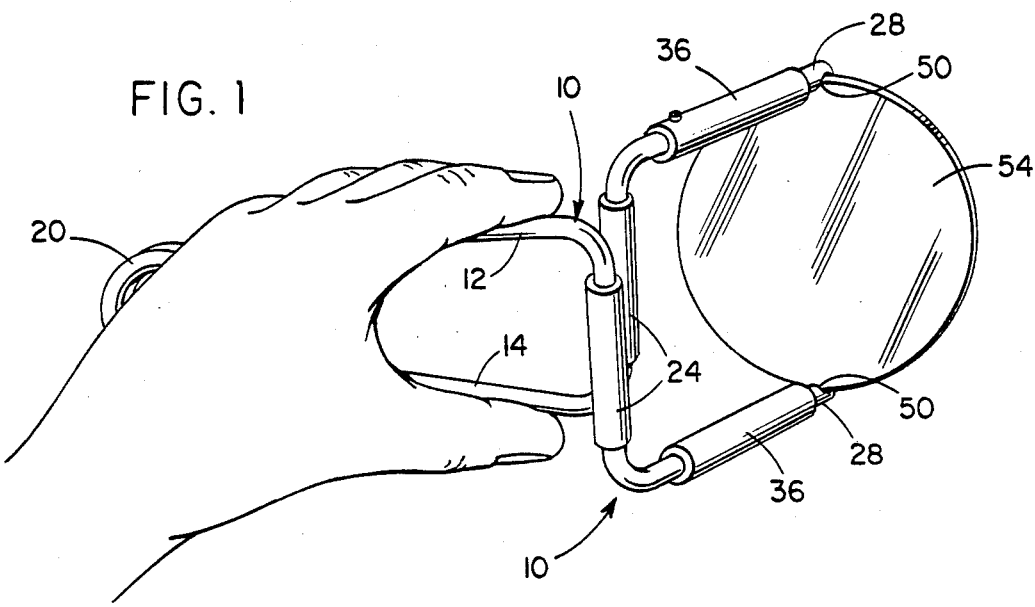
FIG. 1 is a perspective view of the tool being hand held and used to support a disc-shaped wafer.

Referring now more specifically to the drawings the numeral 10 generally designates a first form of tool constructed in accordance with the present invention. The tool 10 includes a pair of elongated generally parallel and substantially rigid arms 12 and 14 including base ends 16 and free ends 18. The arms 12 and 14 are constructed of tubular stock (although solid wire stock may be used for the tool 10) and the base ends 16 of the arms 12 and 14 are joined by an integral coiled portion 20 of tubular stock.

Figure 2:
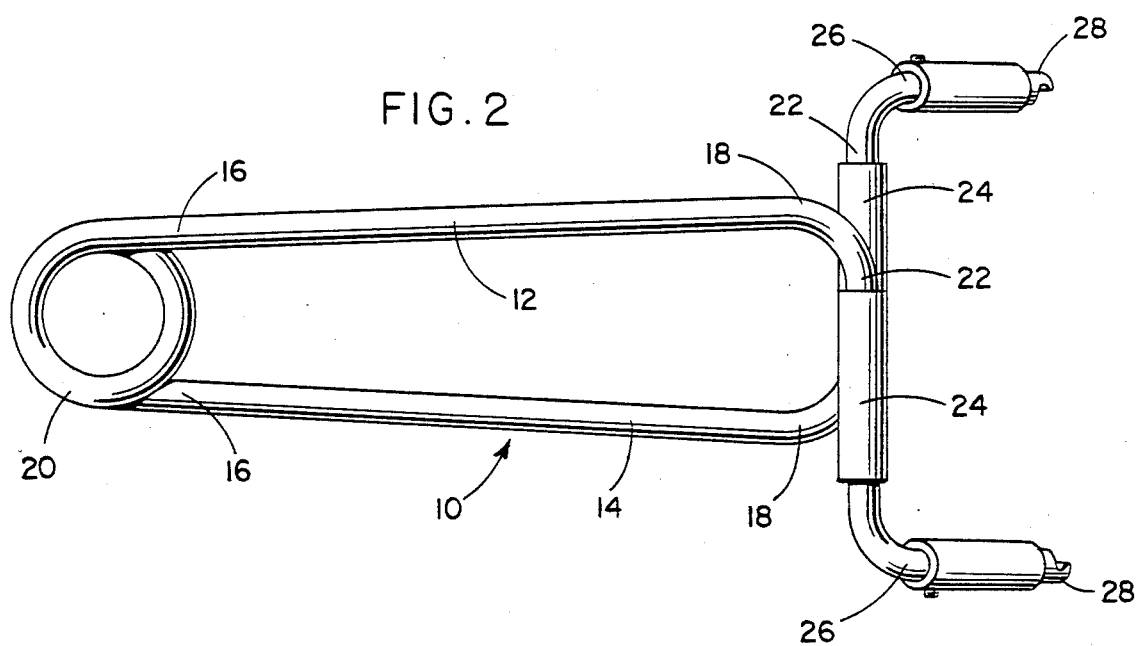
FIG. 2 is a plan view of the tool with the tool in a somewhat flexed condition.
Figure 3:
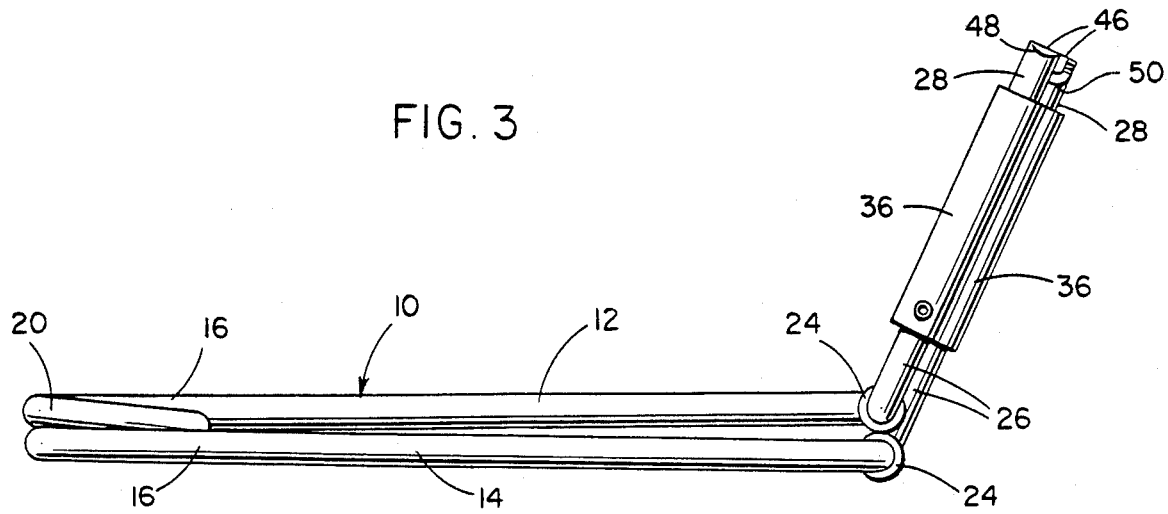
FIG. 3 is a side elevational view of the tool in an inverted position.
Figure 4:
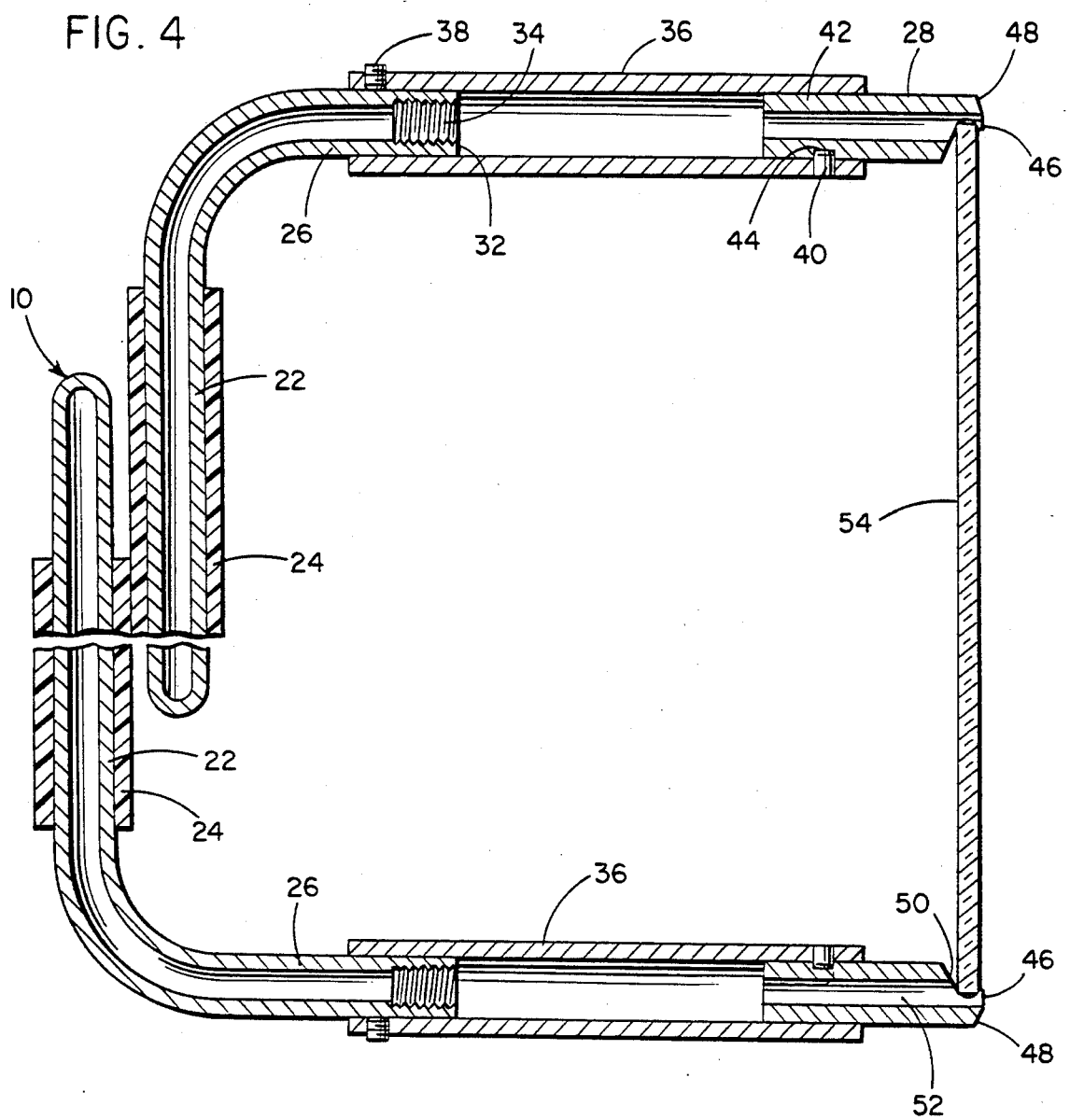
FIG. 4 is an enlarged fragmentary sectional view of the jaw end of the tool illustrating the manner in which a wafer disc is grasped thereby.
Figure 5:
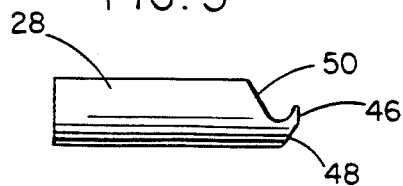
FIG. 5 is a side elevational view of one of the work engaging jaw tips.
Figure 7:
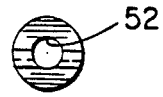
FIG. 7 is an end elevational view of the jaw tip illustrated in FIG. 5 as seen from the right side thereof.
Figure 6:
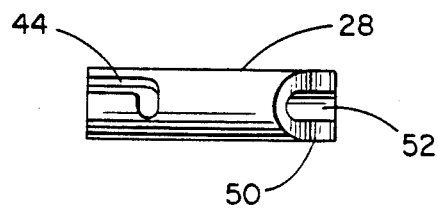
FIG. 6 is a plan view of the jaw tip illustrated in FIG. 5.

The coiled portion 20 comprises connecting means connecting the arms 12 and 14 and functions as a spring whereby the free ends 18 of the arms 12 and 14 are normally spaced further apart than the spacing therebetween illustrated in FIG. 2.

The free ends of the arms 18 include oppositely laterally directed elongated support members 22. The coiled portion 20 supports the base ends of the arms 12 and 14 from each other for swinging movement of the free ends toward and away from each other in generally parallel planes. The support members 22 are disposed in the aforementioned planes and have sleeves 24 thereon with opposing surfaces disposed in sliding contact with each other. Further, the coiled portion 20 is flexed in a manner such that the support members 22 are biased toward each other. Thus, the slidingly engaged opposing surfaces of the sleeves 24 assure that the support members 22 are guided relative to each other for movement in the aforementioned planes. The ends of the support members 24 remote from the corresponding arms are laterally directed in the same direction to define elongated generally parallel jaws 26. The jaws 26 include mounted ends supported from the corresponding support members 22 and work engaging ends from which opposing jaw members 28 are supported.

The support members 22 include first ends mounted from the respective arms and second ends from which the jaws 26 are supported. Further, the work engaging ends of the jaws 26 terminate as at 32 and are internally threaded as at 34. A mounting sleeve 36 is telescoped over the internally threaded work engaging end of each jaw 26 and is removably secured in adjusted longitudinally shifted and angularly rotated position thereon by a set screw 38. The end of each sleeve 36 remote from the corresponding set screw 38 includes a radially inwardly projecting stationery lug 40 and each jaw element 28 is tubular and includes a base end 42 having an L-shaped bayonet groove 44 formed therein in which the corresponding lug 40 is snugly received.

The work engaging end of each jaw element 28 remote from the base end thereof is square cut as at 46, bevelled as at 48 and notched as at 50. It will be noted that the notches 50 oppose each other, that the bevelled portions 48 are disposed on the remote sides of the jaw elements 28 and that the square cut portions 46 face outwardly of the work engaging ends of the jaw elements 28.

Because of the notches 50 and the central longitudinal bore 52 which extends through the jaw elements 28, it may be noted that each jaw element 28 enjoys four points of contact with the periphery of the disc-shaped wafer 54 disposed between the jaw elements 28. The resiliency of the coiled portion 20 serves to yieldingly bias the free ends 18 of the arms 12 and 14 away from each other so that the jaw elements 28 are yieldingly biased toward each other. Thus, it is the resiliency of the coiled portion 20 which causes the jaw elements 28 to grip diametrically opposite portions of the wafer 54. By lightly grasping the tool 10 in the manner illustrated in FIG. 1 the supported wafer may be picked up, moved from one location to another and positioned as desired subsequent to release of the wafer. Release of the wafer 54 is effected by manual pressure being applied to the free ends 18 of the arms 12 and 14 to displace the free ends 18 of the arms toward each other against the opposite biasing action of the coiled portion 20.

The sleeves 24 may be constructed of Teflon, the sleeves 36 may be constructed of Teflon or Stainless Steel and the jaw elements 28 may be constructed of quartz or plastic.

Figure 8:
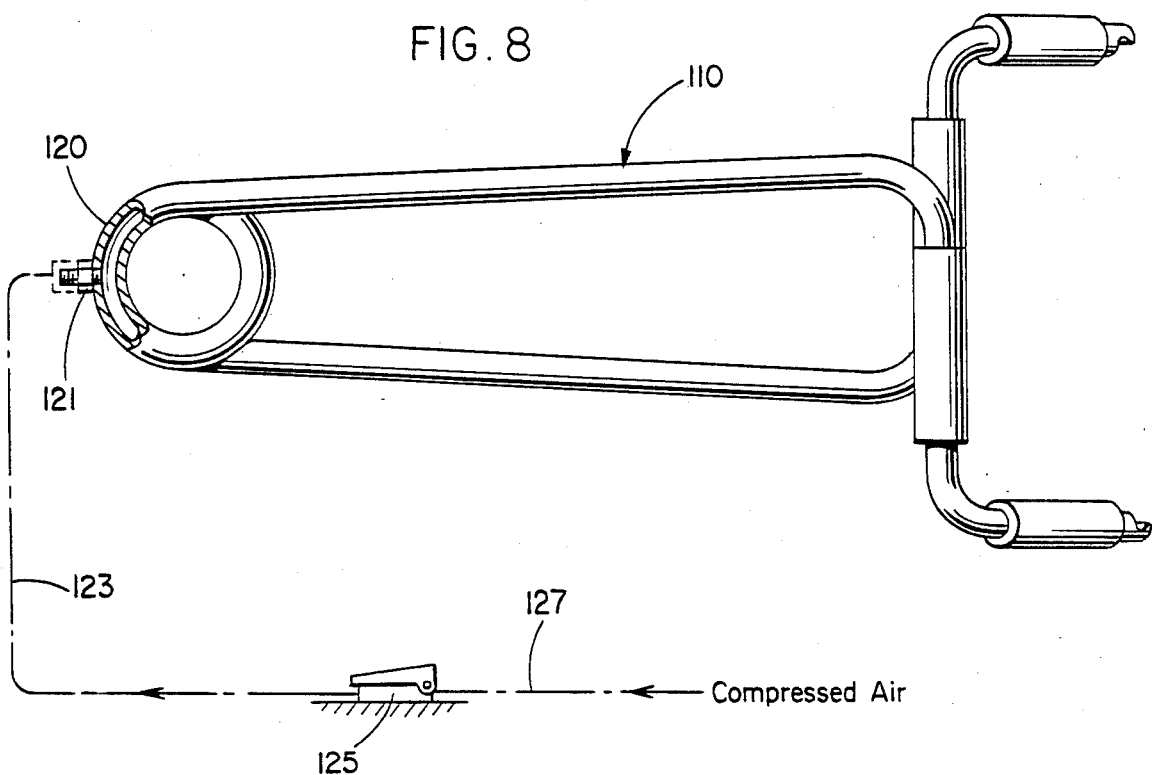
FIG. 8 is a plan view of a modified form of tool utilizing a jaw tip ejector mechanism of the fluid pressure actuated type and operable from a remote location.
Figure 9:
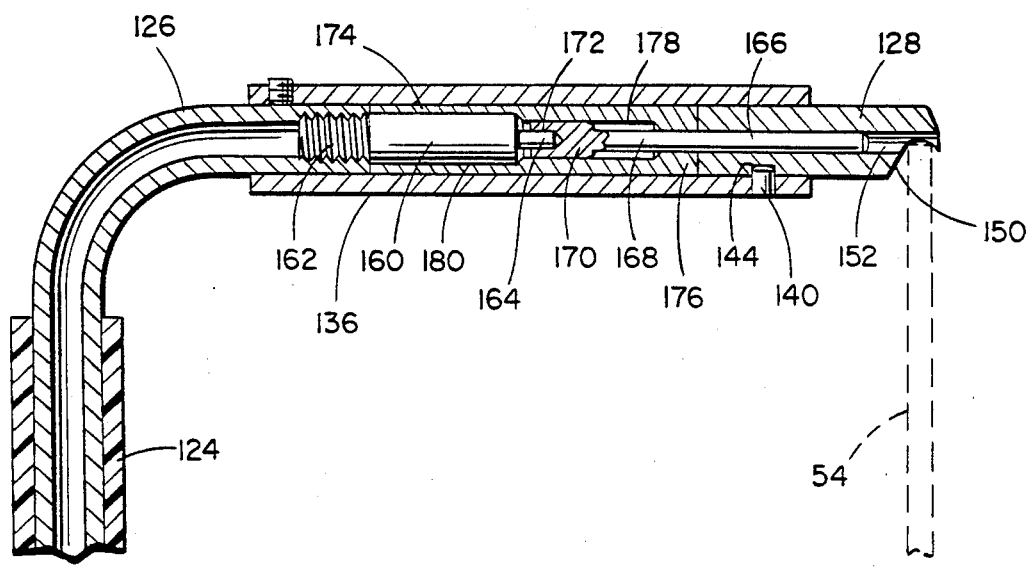
FIG. 9 is an enlarged fragmentary sectional view illustrating one of the jaws of the tool in FIG. 8 including the fluid operated ejector portion thereof.

With attention now invited more specifically to FIGS. 8 and 9 of the drawings, there may be seen a modified form of tool referred to in general by the reference numeral 110. The tool 110 is similar in construction to the tool 10 and various components of the tool 110 which are substantially identical to the various components of the tool 10 are referred to by reference numerals in the 100 series corresponding to the reference numerals applied to the various components of the tool 10.

The coiled portion 120 of the tool 110 includes a fluid pressure inlet fitting 121 to which the discharge end of a fluid pressure hose 123 is connected. The hose 123 includes an inlet end operatively associated with a foot controllable fluid valve 125 and the fluid flow control foot valve 125 is supplied to fluid under pressure through a fluid pressure supply line 127.

With attention now invited more specifically to FIG. 9, a miniature fluid cylinder 160 has its base end 162 threaded into the jaw 126 and includes a spring retracted and fluid pressure extendible push rod 164 projecting from the end thereof remote from the base end 162. A diametrically reduced end 166 of an ejector rod 168 is reciprocally received within the central bore or passage 152 extending through the jaw element 128 and the diametrically enlarged end 170 of the ejector rod 168 includes a socket 172 in which the extended end of the piston rod 164 is received and frictionally retained. A guide sleeve 174 is disposed within the sleeve 136 intermediate the jaw 126 and the jaw element 128. The guide sleeve 174 includes a bore 176 extending therethrough which guidingly and slidingly receives the diametrically reduced end 166 of the ejector rod 168, a first counter bore 178 which guidingly and slidingly receives the diametrically enlarged end 170 of the ejector rod 168 and a second counterbore 180 which snugly receives the cylinder 160 therein. When the cylinder 160 is actuated by compressed air being supplied thereto through the valve 125, the rod 164 is extended to thereby displace the diametrically reduced end 166 of the ejector rod 168 into the notched portion 150 of the jaw element 128. Thus, the diametrically reduced end 166 is capable of ejecting the wafer 54 from supported engagement between the jaw elements 128.

It is pointed out that both cylinders 160 are simultaneously actuated upon actuation of the valve 125 to supply air under pressure to the tool 110 through the fitting 121. Therefore, those portions of the wafer 54 engaged by the jaw elements 128 may be simultaneously ejected therefrom.

It if is desired, the notched portions of the jaw elements 28 and 128 may be provided with notches which include channel-shaped notched inner extremities which open directly toward each other. Such modified jaw elements are particularly well adapted for holding photo masks. In addition, the notched portions of the jaw elements 28 could be transversely widened to provide a jaw element which is perhaps better adapted for picking up wafers in environments where space is not important.

The foregoing is considered as illustrative only of the principles of the invention. Further, since numerous modifications and changes will readily occur to those skilled in the art, it is not desired to limit the invention to the exact construction and operation shown and described, and accordingly, all suitable modifications and equivalents may be resorted to, falling within the scope of the invention. What is claimed as new is as follows.

What is claimed:

1. A wafer handling and placement tool, said tool including a pair of elongated generally parallel arms having base and spaced apart free ends, connecting means connecting said base ends together for relative swinging of said arms in generally parallel planes for movement of said free ends toward and away from each other, each of said free ends supporting an elongated jaw support member having first and second ends with the first ends thereof supported from the corresponding free ends of said arms and the second ends thereof each projecting toward the free end of the other arm, said second ends being disposed in endwise overlapped relation and including elongated jaws supported therefrom having mounted and work engaging ends with said mounted ends supported from said second ends and said work engaging ends projecting in generally the same lateral direction outwardly from said second ends, said work engaging ends including opposing jaw elements supported therefrom adapted to clampingly support opposite peripheral portions of a wafer workpiece therebetween, said jaw support members including opposing lengthwise extending guide surfaces slidingly engaged with each other, said connecting means including means applying opposite lateral forces on said arms serving to bias said support members and the guide surfaces toward each other, said jaw elements being tubular in configuration and projecting endwise outwardly from the work engaging ends of said jaws, the outer ends of said tubular jaw elements having opposing transverse notches formed therein opening into the interiors of said jaw elements, and workpiece ejecting rods reciprocal in the interiors of said tubular jaw elements and lengthwise projectible into the notched portions of said tubular jaw elements for ejecting workpiece portions engaged in said notches.

2. The tool of claim 1 wherein said connecting means includes means operative to yieldingly bias said free ends of said arms away from each other so as to thereby shift said opposing jaw elements toward each other.

3. The tool of claim 1 wherein said elongated jaws generally parallel each other and are disposed in a plane inclined between 45 and 80 degrees relative to the planes in which said arms are swingable relative to each other.

4. The tool of claim 1 wherein said arms and jaw support members are integrally formed from cylindrical stock.

5. The tool of claim 4 wherein said mounted ends of said elongated jaws are also integrally formed from said cylindrical stock.

6. The tool of claim 1 wherein each of said elongated jaw support members includes smooth surface and low surface friction guide structures supported therefrom and disposed in sliding contacting relation with each other defining said guide surfaces.

7. The tool of claim 1 including remotely operable workpiece ejecting rod actuators carried by said jaws.

8. The tool of claim 1 including coacting means carried by said jaws and jaw elements removably supporting said jaw elements from said jaws.

9. A wafer handling and placement tool, said tool including a pair of elongated generally parallel arms having base and spaced apart free ends, connecting means connecting said base ends together for relative swinging of said arms in generally parallel planes for movement of said free ends toward and away from each other, the free ends of said arms including elongated jaw elements supported from and projecting lengthwise outwardly from said arm free ends and including outer terminal ends, said terminal ends including laterally opening transverse notches formed therein opposing each other, said jaw elements being tubular and said notches opening into the interiors of said tubular jaw elements.

10. The combination of claim 9 wherein said terminal ends are square cut and said notches open through said square cut ends along planes defining acute angles with said square cut ends.

11. A wafer handling and placement tool, said tool including a pair of elongated generally parallel arms having base and spaced apart free ends, connecting means connecting said base ends together for relative swinging of said arms in generally parallel planes for movement of said free ends toward and away from each other, the free ends of said arms including elongated jaw elements supported from and projecting lengthwise outwardly from said arm free ends and including outer terminal ends, said terminal ends including laterally opening transverse notches formed therein opposing each other, said jaw elements being tubular in configuration, said notches opening into the interiors of said jaw elements, and workpiece ejecting rods reciprocal in the interiors of said tubular jaw elements and lengthwise projectible into the notched portions of said tubular jaw elements for ejecting workpiece portions engaged in said notches.

* * * * *